(12) United States Patent
Kools

(10) Patent No.: US 6,275,033 B1
(45) Date of Patent: Aug. 14, 2001

(54) MAGNETIC FIELD SENSOR HAVING NICKEL OXIDE AND COBALT CONTAINING FERROMAGNETIC LAYERS

(75) Inventor: Jacques C. S. Kools, Fremont, CA (US)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/013,543

(22) Filed: Jan. 26, 1998

(30) Foreign Application Priority Data

Jul. 1, 1997 (EP) .................................................. 97201997

(51) Int. Cl.⁷ .................................................. G01R 33/02
(52) U.S. Cl. ........................ 324/252; 338/32 R; 428/692; 360/313
(58) Field of Search ........................ 324/252; 338/32 R; 360/113, 313; 428/692, 900

(56) References Cited

U.S. PATENT DOCUMENTS 5,904,996 * 5/1999 Van Der Zaag et al. ............ 324/252

OTHER PUBLICATIONS

Magnetoresistance of Symmetric Spin Valve Structures by Thomas C. Anthony and James A. Brug, IEEE Transactions on Magnetics, vol. 30, No. 6, Nov. 1994.

* cited by examiner

Primary Examiner—Walter Snow
(74) Attorney, Agent, or Firm—Norman N. Spain

(57) ABSTRACT

A magnetic field sensor comprising a layered structure (3) $E/F_o/S/F$, in which:

E is an exchange-biasing layer, comprising nickel oxide;

$F_o$ is a ferromagnetic layer with a fixed magnetization, comprising cobalt;

S is a spacer layer;

$F_f$ is a ferromagnetic layer with a free magnetization, whereby the material of the layer $F_f$ has a magnetostriction constant of at most $1.5 \times 10^{-6}$ and a crystal anisotropy of at most $1.3 \text{ J/m}^3$. Such a structure (3) demonstrates a relatively high magneto-resistance ratio (of the order of 15%), and yet a relatively low coercivity (of the order of 0.2 kA/m). Examples of suitable materials for use in the layer $F_f$ include $Ni_{66}Fe_{16}Co_{18}$ and $Ni_{72}Fe_{21}Co_7$.

8 Claims, 2 Drawing Sheets

MAGNETIC FIELD SENSOR HAVING NICKEL OXIDE AND COBALT CONTAINING FERROMAGNETIC LAYERS

BACKGROUND OF THE INVENTION

The invention relates to a magnetic field sensor comprising a layered structure $E/F_o/S/F_f$, in which:

E is an exchange-biasing layer, comprising nickel oxide;

$F_o$ is a ferromagnetic layer with a fixed magnetization, comprising cobalt;

S is a spacer layer;

$F_f$ is a ferromagnetic layer with a free magnetization. For the sake of clarity, a number of terms in this definition will here be further elucidated:

1. The terms "fixed" and "free" in relation to the magnetizations of the layers $F_o$ and $F_f$ are intended to have a relative meaning, viz. the magnetization $M_f$ of the layer $F_f$ is "free" with respect to the magnetization $M_o$ of the layer $F_o$ if, under the influence of an applied external magnetic field H, $M_f$ can be more easily rotated from its equilibrium position than $M_o$;

2. The magnetization $M_o$ is "fixed" by exchange-biasing the layer $F_o$ to the layer E;

3. The term "nickel oxide" refers to any stoichiometric or non-stoichiometric compound of nickel and oxygen. Although the symbol "NiO" will frequently be used in this context, this symbol should be viewed as encompassing compounds of the form $NiO_{1\pm\delta}$, in which $\delta$ is a relatively small fraction.

Magnetic field sensors of this type may be employed inter alia:

as magnetic heads, which can be used to decrypt the magnetic flux emanating from a recording medium in the form of a magnetic tape, disc or card;

in compasses, for detecting the terrestrial magnetic field, e.g. in automotive, aviation, Maritime or personal navigation systems;

in apparatus for detecting position and/or angle, e.g. in automotive applications;

as field sensors in medical scanners, and as replacements for Hall probes in various other applications;

as memory cells in Magnetic Random-Access Memories (MRAMs);

as current detectors, whereby the magnetic field produced by such a current is detected.

A layered structure as described in the opening paragraph is known, for example, from an article by T. C. Anthony et al. in *IEEE Trans. Magn.* 30 (1994) pp. 3819–3821, in which the system NiO/Co/Cu/Co is studied. The authors report advantageously large room-temperature magneto-resistance (MR) ratios of up to 17% in this system (as compared to typical values of about 4–6% in conventional multilayers, i.e. multilayers using an FeMn exchange-biasing layer). However, the coercivity of the free Co layer is disappointingly high, with values of the order of 3 kA/m being observed in inner loop measurements (as compared to values of the order of 0.2–0.4 kA/m in conventional multilayers). Such high coercivity values greatly hinder potential use of the NiO/Co/Cu/Co system in practical applications.

SUMMARY OF THE INVENTION

It is an object of the invention to alleviate this problem. More particularly, it is an object of the invention to provide a NiO-exchange-biased magnetic field sensor having a relatively large room-temperature MR ratio and yet having a relatively low free-layer coercivity.

These and other objects are achieved according to the invention in a magnetic field sensor as described in the opening paragraph, characterized in that the material of the layer $F_f$ has a magnetostriction constant of at most $1.5 \times 10^{-6}$ and a crystal anisotropy of at most 1.3 J/m$^3$.

The invention exploits the realization that the coercivity of a ferromagnetic thin film is influenced by the size of spatial anisotropy fluctuations, since such fluctuations tend to lead to domain wall pinning. An important contributor to this effect is the magnetostriction anisotropy, which should therefore be as low as possible. However, the inventors have realized that there is a second contributor in the case of an NiO-based multilayer which simply does not play a role in the case of FeMn-based multilayers. This can be explained as follows.

Conventional multilayers are usually deposited on a Ta seed layer, which induces a (111) crystallographic texture in subsequently deposited layers. Metals with a face-centered-cubic (fcc) crystal structure do not display crystal anisotropy in the (111) plane, and, thus, any such metal (such as Co) deposited upon a Ta seed layer will be automatically free of crystal anisotropy. However, when such a metal is deposited upon NiO, the situation is radically different; it has been observed that layers grown on NiO display a weak or incomplete (111) texture, and, consequently, such layers will not in general be free of crystal anisotropy. It is therefore important in this case to choose a material which has an intrinsically low crystal anisotropy of itself. Now, in a conventional multilayer, the FeMn exchange-biasing layer is situated at or towards the top of the layered structure (as one progresses away from the substrate); this is permissible because FeMn is a relatively good electrical conductor, so that it is thus possible to make electrical contact with the structure via the top layer. However, in contrast, NiO is an electrical insulator, and thus cannot be located at the top of the layered structure if electrical contact is to be made with the structure via its top layer. The NiO exchange-biasing layer must thus be situated at the bottom of such a structure. Consequently, the NiO acts as a substrate for the subsequently deposited layers, which (according to the above arguments) must thus have an intrinsically low crystal anisotropy.

In the most ideal case, the crystal anisotropy of the free ferromagnetic layer $F_f$ will be exactly zero or at least substantially zero. In practice, this can be difficult to achieve; however, the inventors have determined that satisfactory results can still be obtained with non-zero crystal anisotropies less than 1.3 J/m$^3$. In this context, it should be noted that the crystal anisotroy is in fact a series expansion of terms, in which the third and higher-order terms are, in general, substantially negligable with respect to the first and second-order terms. For practical purposes therefore, any reference to the crystal anisotropy in this text may be regarded as a reference to the sum of the first and second-order terms in the series expansion.

Free-layer ($F_f$) materials with the inventive properties listed in claim 1 occur among the alloys $Ni_xFe_yCo_z$, in which:

x+y+z=100, $64 \leq x \leq 74$, $15 \leq y \leq 22$. Preferential examples of suitable such alloys include $Ni_{66}Fe_{16}Co_{18}$ and $Ni_{72}Fe_{21}Co_7$. For example, the inventors have observed that a test multilayer with the structure:

Si(100)/50 nm NiO/3 nm $Co_{90}Fe_{10/Cu/Ff}$/Ta demonstrates an MR-ratio of 12.7% in combination with a free-layer coercivity of just 0.3 kA/m when the layer $F_f$ is comprised of 5 nm $Ni_{66}Fe_{16}Co_{18}$.

A further embodiment of the sensor according to the invention is characterized in that a laminar portion of the layer $F_f$ along its interface with the layer S is predominantly comprised of cobalt. An example of a suitable material for use in such an "interface layer" is $Co_{90}Fe_{10}$; however, pure Co may also be used, for example. Specifically, in the case of the above-mentioned test multilayer, using the composite 0.8 nm $Co_{90}Fe_{10}$/4.2 nm $Ni_{66}Fe_{16}Co_{18}$ as the layer $F_f$ (with the $Co_{90}Fe_{10}$ interface layer adjacent to the Cu spacer layer) produces a multilayer with an MR-ratio of 14.1% and a free-layer coercivity of 0.2 kA/m.

The quantity of any element is the above-mentioned alloys recited as having a specific composition may vary in the amount of ±2 at. %.

The spacer layer S may be comprised of various different materials, such as Cr, Mn, Ru, and Ag, for example. However, a preferential embodiment of the sensor according to the invention is characterized in that the spacer layer S is comprised of Cu or Au. These latter metals have resistivity values (of the order of about 2.2–2.5 $\mu\Omega$/cm) which are relatively low compared to those of the former metals (of the order of about 10–15 $\mu\Omega$/cm). Cu is particularly advantageous, because it is relatively inexpensive compared to Au.

The deposition of NiO on an underlying substrate can generally proceed without the assistance of a Ta template layer (unlike the deposition of FeMn, in which case the anti-ferromagnetic γ-FeMn phase has to be stabilized). Consequently, a particular embodiment of the sensor according to the invention is characterized in that the layer E is deposited directly on a silicon substrate (e.g. a Si(100) single crystal). Other possible substrate materials include glass, quartz and $Al_2O_3$, for example.

The basic multilayer structure $E/F_o/S/F_f$ will generally be sensitive to oxidation, which can cause deterioration of its magnetic and electrical properties. For these reasons, the layer $F_f$ is preferably covered by an (electrically conductive) oxidation barrier, such as a Ta layer.

Another possibility is to use a NiO overlayer as the oxidation barrier. This has the advantage that NiO acts as an electron reflector, which leads to an increase in the MR-ratio; moreover, during deposition of the layered structure, a NiO source is already present for use in depositing the exchange-biasing layer E, so that use of an extra source is avoided. However, electrical contact with the layered structure via its top layer is then hindered, so that contact must be made via the sides of the structure. Other oxidic alternatives to NiO include SiO, $SiO_2$ $Al_2O_3$ and MgO, for example.

BRIEF DESCRIPTION OF THE DRAWING

In the drawing.

Corresponding features in the different Figures are denoted by the same reference symbols.

DETAILED DESCRIPTION OF THE INVENTION

Figure 1:
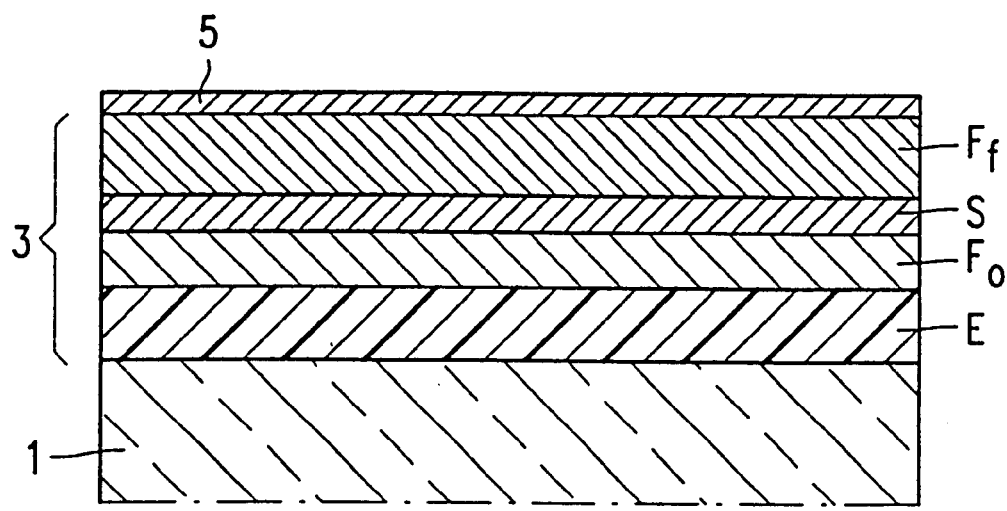
FIG. 1 renders a cross-sectional view of part of a magnetic field sensor according to the invention.

The invention will now be described in greater detail with reference to the figures of the drawing and the following examples:

Embodiment 1

FIG. 1 shows a cross-sectional view of part of a particular embodiment of a magnetic field sensor according to the present invention. A substrate 1 has been provided with an exchange-biased spin-valve multilayer structure 3, which is capped by an oxidation barrier layer 5. The substrate 3 may, for example, be a Si(100) crystal, whereas the layer 5 may be comprised of Ta, Pt or Au, for example.

The layered structure 3 is consecutively comprised of a NiO exchange-biasing bottom layer E, a ferromagnetic layer $F_o$, a spacer layer S, and a ferromagnetic layer $F_f$. By virtue of its exchange-biasing with the layer E, the layer $F_o$ has a fixed magnetization direction; on the other hand, the layer $F_f$ has a free magnetization direction. The layers $F_o$ and S may, for example, be comprised of 3 nm $Co_{90}Fe_{10}$ and 2 nm Cu, respectively. In this particular case, the layer E has a thickness of 50 nm.

In accordance with the invention, the layer $F_f$ is comprised of a material whose magnetostriction constant and crystal anisotropy are both essentially negligible, e.g. $Ni_{66}Fe_{16}Co_{18}$.

The NiO layer E was deposited using RF magnetron sputtering at 1 mTorr Ar. The layers S and 5 were deposited by DC magnetron sputtering at 5 mTorr Ar. The layer $F_f$ was deposited by magnetron sputter deposition at room temperature, the background pressure prior to deposition being about $3\times10^{-7}$ Pa (approximately 40% of which was due to the presence of water vapor and hydrogen).

Embodiment 2

Figure 2:
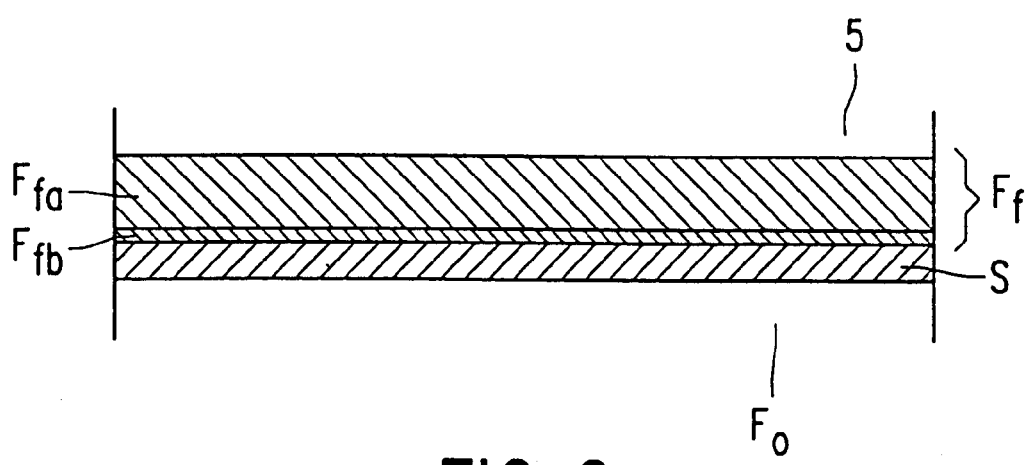
FIG. 2 shows part of the subject of FIG. 1, and includes a modification in accordance with a particular embodiment of the invention.

FIG. 2 shows a modification of part of the subject of FIG. 1, in accordance with a particular embodiment of the invention. The layer $F_f$ is now composite, and comprises a principal portion $F_{fa}$ and a thin laminar portion $F_{fb}$; this laminar portion $F_{fb}$ is located along the interface with the layer S, and is predominantly comprised of cobalt.

In this particular example, the principal portion $F_{fa}$ is comprised of 4.2 nm $Ni_{66}Fe_{16}Co_{18}$ and the laminar portion $F_{fb}$ is comprised of 0.8 nm $Co_{90}Fe_{10}$.

Embodiment 3

Figure 3:
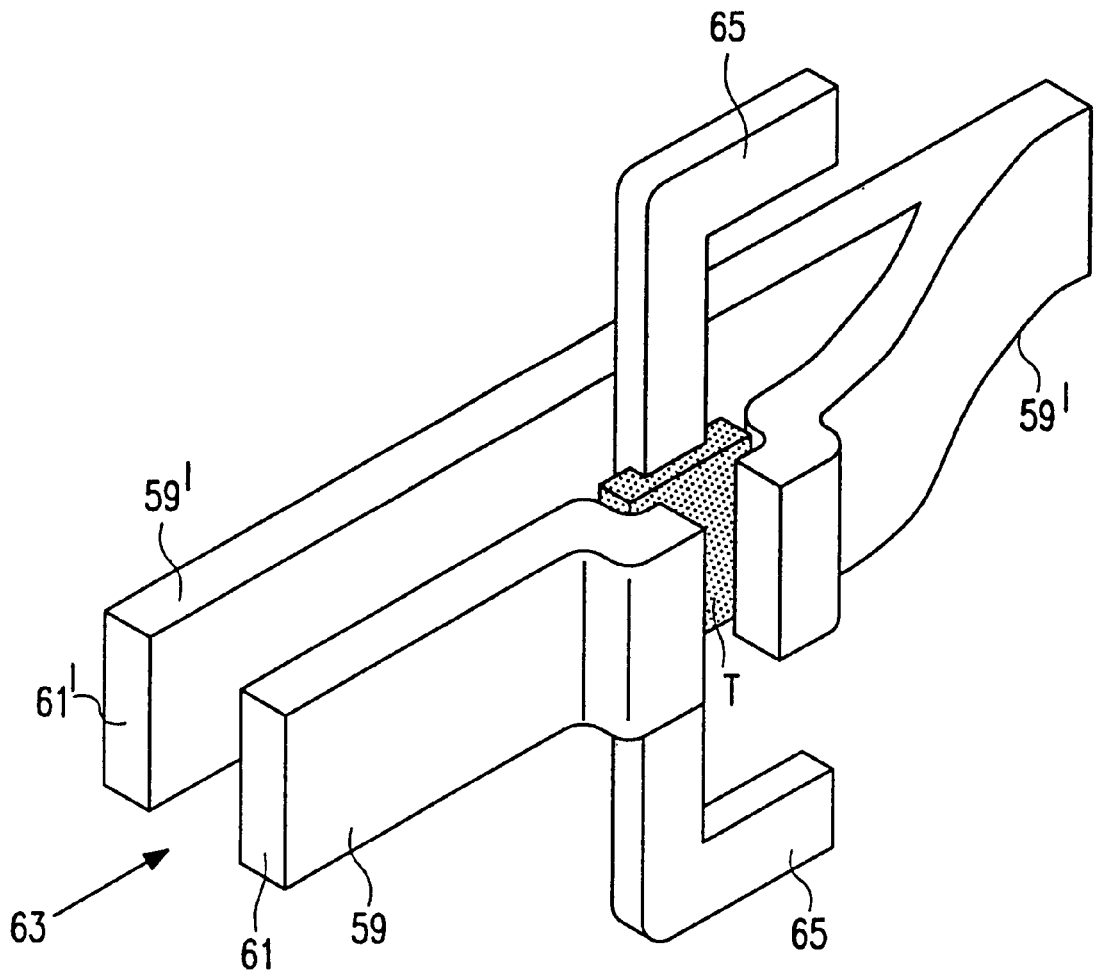
FIG. 3 gives a perspective view of a magnetic read head (magnetic field sensor) in accordance with the invention.

FIG. 3 renders a schematic perspective view of part of a magneto-resistive magnetic read head (magnetic field sensor) according to the invention. The head comprises a transducer T (e.g. the sensor described in Embodiment 1 or 2) with electrical connections 65. The head additionally comprises flux guides 59,59', which are positioned relative to the transducer T so as to form a magnetic circuit. The end faces 61,61' form part of the pole face of the head, the magnetic gap 63 being located between said faces 61,61'.

If a magnetic medium, such as a magnetic tape, disc or card, passes before the faces 61,61' in close proximity thereto, the magnetically-stored information on that medium will generate a varying magnetic flux in the above-mentioned magnetic circuit, which magnetic flux is also fed through the transducer T. The transducer T transcribes this varying magnetic flux into electrical resistance variations, which can be measured via the electrical connections 65.

The head may also contain an electrical coil, which can be employed in the recording of magnetic information on magnetic media.

The head hereabove described and illustrated in the Figure is a so-called Yoke-type magnetic head. However, the invention may also be applied in the manufacture of other types of magnetic heads, such as Shielded-type heads, for example.

What is claimed is:

1. A magnetic field sensor comprising a layered structure $E/F_o/S/F_f$, in which:
   E is an exchange-biasing layer, comprising nickel oxide;
   $F_o$ is a ferromagnetic layer with a fixed magnetization, comprising cobalt;
   S is a spacer layer;
   $F_f$ is a ferromagnetic layer with a free magnetization, characterized in that the material of the layer $F_f$ has a magnetostriction constant of at most $1.5 \times 10^{-6}$ and a crystal anisotropy of at most $1.3$ J/m$^3$.

2. A sensor according to claim 1, characterized in that the crystal anisotropy of the layer $F_f$ is essentially zero.

3. A sensor according to claim 1, characterized in that the layer $F_f$ comprises an alloy $Ni_xFe_yCo_z$, in which:
   $x+y+z=100$,
   $64 \leq x \leq 74$,
   $15 \leq y \leq 22$.

4. A sensor according to claim 3, characterized in that the layer $F_f$ comprises an alloy selected from the group consisting $Ni_{66}Fe_{16}Co_{18}$ and $Ni_{72}Fe_{21}Co_7$.

5. A sensor according to claim 1, characterized in that a laminar portion of the layer $F_f$ along its interface with the layer S consists essentially of cobalt.

6. A sensor according to claim 5, characterized in that the laminar portion comprises $Co_{90}Fe_{10}$.

7. A sensor according to claim 2, characterized in that the layer $F_f$ is comprises an alloy $Ni_xFe_yCo_z$ wherein:
   $x+y+z=100$,
   $64 \leq x \leq 74$,
   $15 \leq y \leq 22$.

8. A sensor according to claim 2, characterized in that a laminar portion of the layer $F_f$ along its interface with the layer S consists essentially of cobalt.

* * * * *